United States Patent
Minamide et al.

[11] Patent Number: 5,285,075
[45] Date of Patent: Feb. 8, 1994

[54] ELECTRON BEAM LITHOGRAPHY METHOD

[75] Inventors: Yoshinori Minamide, Katsuta; Genya Matsuoka, Tokyo; Hiroyoshi Ando, Katsuta, all of Japan

[73] Assignee: Hitachi, Ltd., Tokyo, Japan

[21] Appl. No.: 964,049

[22] Filed: Oct. 21, 1992

[30] Foreign Application Priority Data

Oct. 21, 1991 [JP] Japan .................................. 3-271667

[51] Int. Cl.$^5$ ............................................ H01J 37/304
[52] U.S. Cl. ................................................. 250/491.1
[58] Field of Search ............ 250/491.1, 492.2, 492.22, 250/310, 398

[56] References Cited

U.S. PATENT DOCUMENTS 4,546,260 10/1985 Simpson et al. .................. 250/491.1
4,808,829 2/1989 Okumura et al. ................. 250/491.1

FOREIGN PATENT DOCUMENTS 0297 247 1/1989 European Pat. Off. .
57-211733 12/1982 Japan .
62-029136 2/1987 Japan .

Primary Examiner—Paul M. Dzierzynski
Assistant Examiner—Kiet T. Nguyen
Attorney, Agent, or Firm—Antonelli, Terry Stout & Kraus

[57] ABSTRACT

A sample stage is moved so that an alignment mark on a wafer successively move on positions symmetric to the positional origin of the electron beam, and waveformes of signals obtained by scanning the alignment mark at the symmetric positions with electron beam are added each other so as to be symmetry and decrease the alignment-mark position detecting error.

8 Claims, 4 Drawing Sheets

ELECTRON BEAM LITHOGRAPHY METHOD

BACKGROUND OF THE INVENTION

The present invention relates to an electron beam lithography method, particularly to an electron beam lithography method capable of accurately detecting alignment marks while moving a wafer.

In a general electron beam lithography apparatus, a semiconductor wafer is set in a cassette (jig) mounted on a wafer stage to lithograph a chip pattern on the wafer.

The position of the pattern is relatively determined on the basis of alignment marks on the wafer.

An electron beam is deflected in accordance with a lithograph pattern. Therefore, when the position (coordinate values) of an alignment mark is deviated from a design value, it is necessary to correct the deflection signal of the electron beam by the deviation.

The position of an alignment mark is measured by controlling the wafer stage and setting the alignment mark on a wafer to a positional origin of the electron beam (which means the position of the electron beam in the case when the electron beam is not deflected by a deflector).

The alignment mark on the wafer is constructed with a wafer mark 11 which aligns the wafer 206 and a chip mark 12 which aligns chip patterns 13. The positional origin of the electron beam is usually measured by detecting the wafer mark which is moved by moving the wafer stage. Therefore, if the positions of the wafer mark 11 and the chip mark 12 are designed correctly without any positional design error, the positional origin of the electron beam measured by detecting the chip mark is measured correctly too.

But, when the wafer is deformed, the wafer mark is not set correctly on the positional origin of the electron beam measured by detecting the chip mark.

Moreover, positions of alignment marks are conventionally detected by applying the electron beam to the alignment marks and detecting electrons reflected from the marks by means of two reflected electron detectors set at positions symmetrical with respect to the electron beam origin. Therefore, if alignment marks are detected on a position which is apart from the positional origin of the electron beam or the reflected electron detectors are not disposed at positions symmetrical with respect to the origin, waveforms outputted by the reflected electron detectors become asymmetrical and thereby, errors occur in detecting positions of marks.

Japanese Patent Laid-open No. 57-211733(1982) discloses that alignment marks are scanned twice in two different directions and obtained mark detection signals are arithmetically averaged to decrease the errors due to the asymmetrical waveforms.

It is also performed to improve S/N of detection signals by scanning marks several times and arithmetically averaging obtained scanning signals to decrease the influence of random noises.

However, the above method has a problem that it takes much time and the apparatus throughput decreases because a plurality of marks on a wafer are successively measured by repeating the movement and stop of a stage (step-and-repeat system).

Therefore, Japanese Patent Laid-open No. 58200536(1983) discloses the so-called continuous stage moving system for detecting positions of marks while continuously moving a stage.

However, the continuous stage moving system has a problem that measurement errors increase due to asymmetry of detection signal waveforms because each mark position cannot be detected just under the positional origin of the electron beam though the mark detection time can be decreased.

Japanese Patent Laid-open No. 62-29136(1987) discloses a method for setting a function to estimate the skewness of detection signal waveforms and thereby correcting the asymmetry in accordance with scanning position.

Actually, however, asymmetry is not completely corrected because the skewness of mark detection signals cannot accurately be estimated.

SUMMARY OF THE INVENTION

Object of the present invention is in providing an electron beam lithography apparatus capable of improving the throughput of the apparatus using the continuous stage moving system and of accurately correcting the asymmetry of the mark detection signals.

In order to solve the above problem, an alignment mark on a sample is continuously moved to positions which are symmetrical with respect to the positional origin of the electron beam, each reflected signals obtained by irradiating the electron beam on the alignment marks at symmetrical positions are stored in a memory, the stored reflected signals are added so as to generate a symmetrical waveform, and thereby a central positional information of the symmetrical waveform is extracted.

DETAILED DESCRIPTION OF THE PREFERRED EMBODIMENT

An embodiment of the present invention is described below by referring to FIGS. 1 to 4.

As generally known, a wafer is lithographed many patterns one after another in accordance with processes including diffusion and evaporation in manufacturing LSI.

Figure 1:
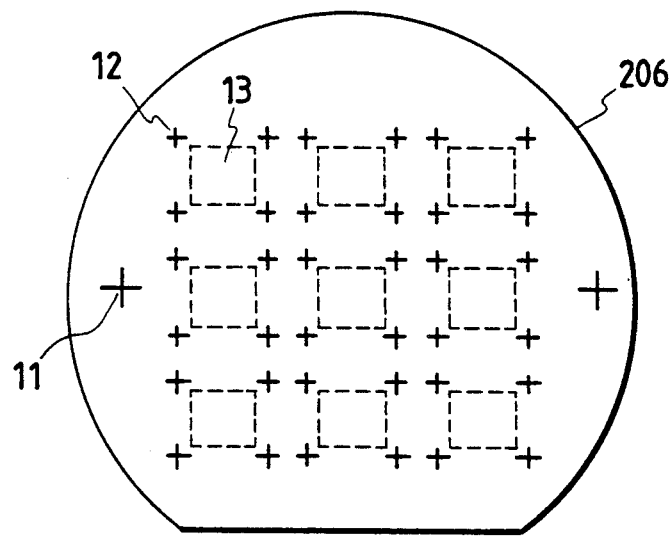
FIG. 1 is a schematic view which shows an example of the arrangement of alignment marks on a wafer.

When lithographing a pattern on a wafer 206 at first, two types of alignment marks, that is, the wafer mark 11 and chip mark 12 as shown in FIG. 1 are lithographed on the wafer 206. In lithographing another patterns at the second times and thereafter, patterns are aligned on the basis of positions of the above two types of alignment marks, and at the same time, errors such as expansion and contraction, and rotation of the wafer are corrected.

The present invention relates to the pattern alignment of the lithography in the second times and thereafter and an embodiment of the such pattern alignment is explained as follows;

At first, the wafer 206 is mounted on a cassette which is not shown in the figure and set it on the stage 207 of an electron beam lithography apparatus. The position of the wafer mark 11 is detected to measure the expansion and contraction, and rotation of the wafer 206, and positional errors of the wafer mark 11 due to these factors are corrected.

Then, the positions of the chip marks 12 are detected so as to lithograph patterns 13 on the wafer 206 one after another.

Figure 2:
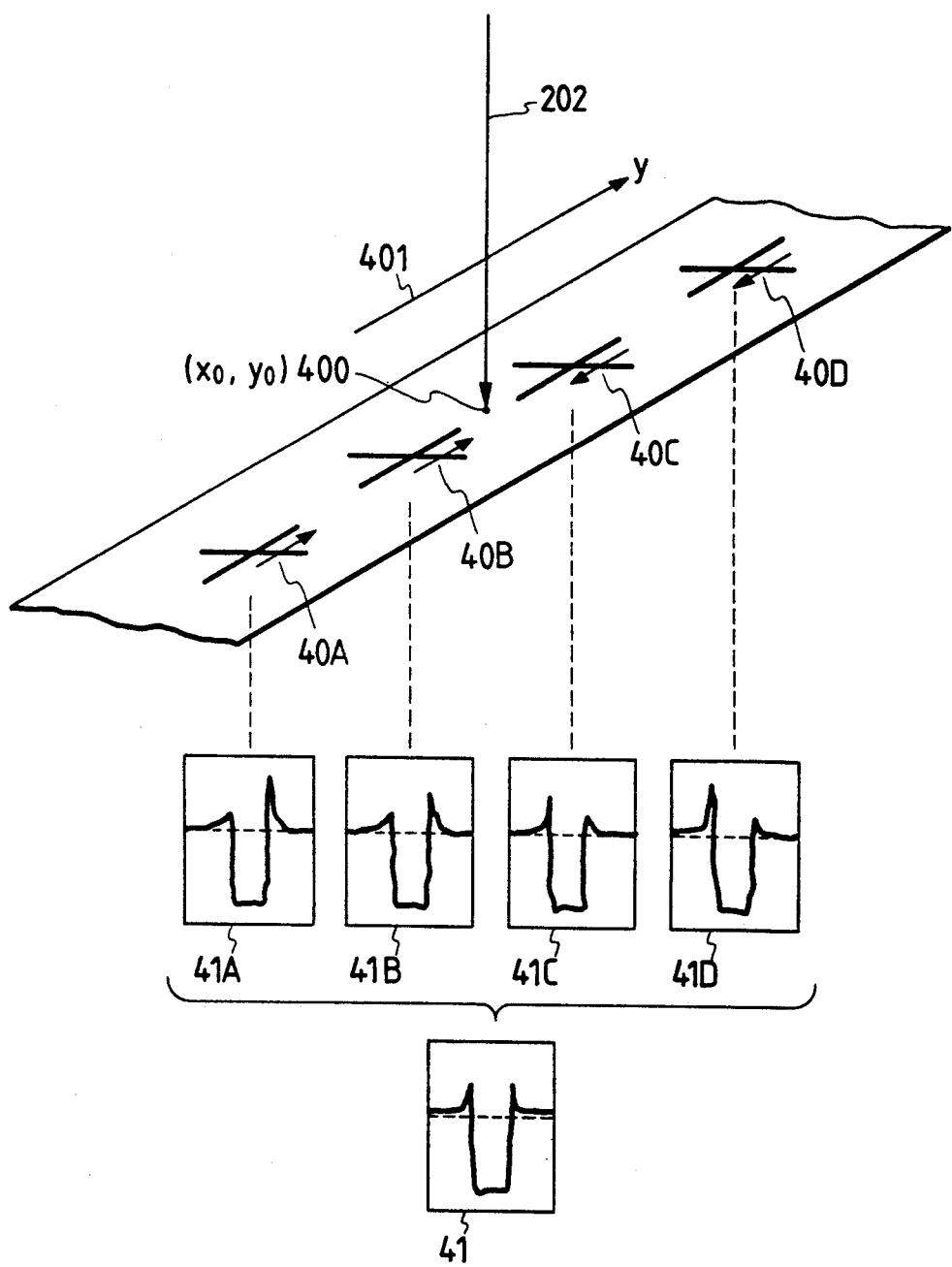
FIG. 2 is a illustrative view of an alignment mark position detecting system moved at symmetrical positions according to the present invention.

According to the present invention, the position of each chip mark 12 is continuously detected at plural positions 40A, 40B, 40C, 40D as shown in FIG. 2 while the stage mounting the wafer 206 is continuously moved so that the each chip mark 12 passes a positional origin 400($Y_0$, $Y_0$) of the electron beam. In FIG. 1, for example, the stage 207 is moved so that each chip mark 12 successively passes the positional origin of the electron beam from the left bottom to the left top upwardly, and then, the stage shifts to the adjacent chip-mark line on the right side to move the wafer from the bottom to the top of the chip marks upwardly.

FIG. 2 shows the positions that same one of the chip marks follows in movement of the stage. That is, the chip mark concerned successively passes the positions 40D, 40C, 40B, and 40A in the Y-direction 401.

In this case, it is assumed that the positions 40D and 40A are located at equal distances from the origin 400 of the electron beam 202, and the positions 40C and 40B are also located at equal distances from the positional origin 400.

If the chip mark is scanned by deflecting the electron beam 202 when the chip mark arrives at the positions 40D, 40C, 40B, and 40A in order by moving the stage 207, the waveforms of 41D, 41C, 41B, and 41A shown at the lower part of FIG. 2 are obtained through a reflected-electron detector in accordance with each position.

If the chip mark reaches the positional origin of the electron beam, the same amounts of electrons reflected from the chip mark are inputted to the above two reflected-electron detectors. Therefore, the output forms a symmetrical waveform shown by the numeral 41 in FIG. 2.

But, as the chip marks is detected at the positions such as 40D, 40C, 40B, and 40A which are deviated from the positional origin 400, the intensities of reflected electrons inputted to two reflected-electron detectors 205, 205' are unbalanced. Therefore, the position signal waveforms 41D, 41C, 41B, and 41A become asymmetrical.

However, if the marks such as 41D and 41A are located at equal distances from the positional origin 400 of the electron beam, the position signal waveforms corresponding to the marks 41D and 41A are reverse to each other. The same holds true for the waveforms 41C and 41B.

Therefore, for the present invention, the same symmetrical waveform as the waveform 41 is obtained by adding position signal waveforms to each other which are reverse to each other.

In the case the number of waveforms to be added is increased, the symmetry of the above waveform is improved further because the variation of the waveforms is averaged. Therefore, all the waveforms 41D, 41C, 41B, and 41A are added.

Figure 5:
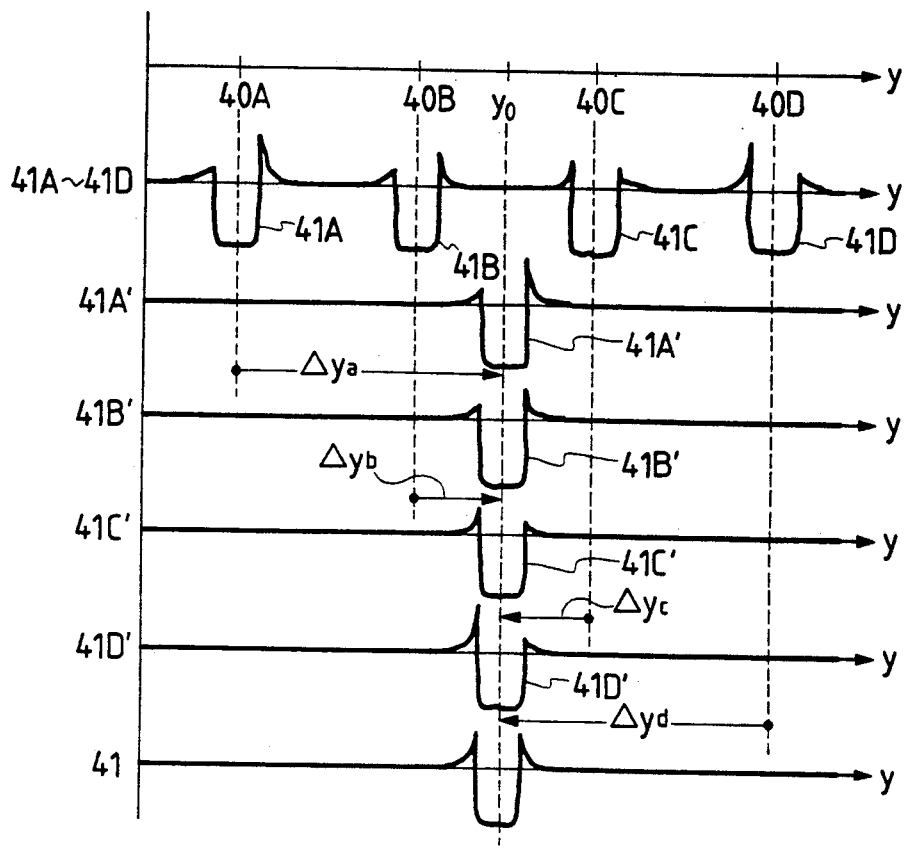
FIG. 5 is a schematic view which shows correcting method of the waveforms detected by detector in the present invention.

Here, as the addition of the waveforms stated above is performed by adding the waveforms which are respectively detected at different times corresponding to the different positions, it is necessary to accurately superimpose the waveforms one upon another by shifting the time base as shown FIG. 5.

While the same chip mark is moved along the Y axis of the stage 207, the electron beam is scanned so as to detect the same chip mark at the positions 40A, 40B, 40C, 40D. The positions 40A and 40D are located in a same distance from the position $y_0$ on the Y axis and the positions 40B and 40C are located in a same distance from the position $y_0$.

The waveform 41A which is detected the chip mark at the position 40A is sifted as a moving time of the stage for moving a distance $\Delta ya$ between the positions 40A and $y_0$ and the waveform 41A' is obtained. In the same way, a waveforms 41B', 41C', 41D' are obtained by shifting the waveforms 41B, 41C, 41D as moving time of the stage for moving distances $\Delta yb$, $\Delta yc$, $\Delta yd$. A waveform 41 which should be detected at the position $y_0$ is obtained by adding the waveforms 41A', 41B', 41C', 41D'.

Figure 6:
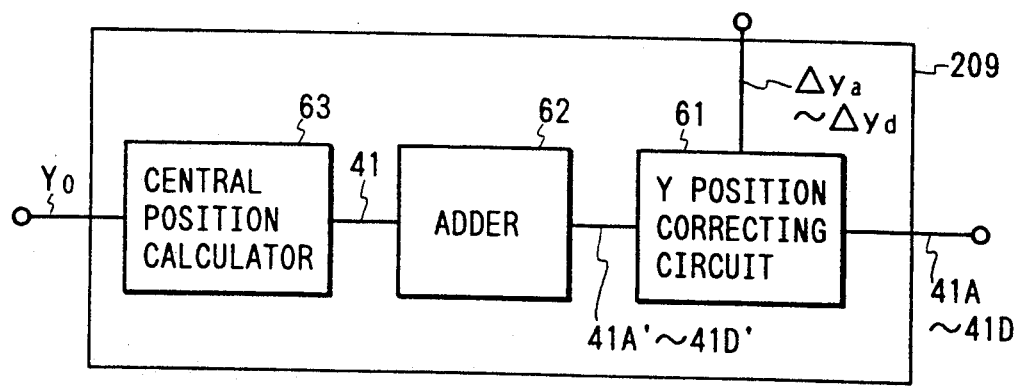
FIG. 6 is a block diagram which shows a electron beam control unit 209 of FIG. 4 in detail in the present invention.

FIG. 6 shows a block diagram which obtains the waveform 41 from the waveforms 41A', 41B', 41C', 41D'.

Numeral 61 shows a Y position correcting circuit for obtaining the waveforms 41A', 41B', 41C', 41D' by shifting the waveforms 41A, 41B, 41C, 41D as the times for respectively moving the stage as the distances $\Delta ya$, $\Delta yb$, $\Delta yc$, $\Delta yd$. Numeral 62 denotes an adder for adding the waveforms 41A', 41B', 41C', 41D'. Numeral 63 denotes a central position calculator for obtaining the central position of the waveform 41 by calculating the waveform.

In FIGS. 5 and 6, the waveforms 41A, 41B, 41C, 41D are added by shifting the times corresponding to the distance $\Delta ya$, $\Delta yb$, $\Delta yc$, $\Delta yd$.

In the present invention, the time difference corresponding to the distance $\Delta ya$, $\Delta yb$, $\Delta yc$, $\Delta yd$ may be corrected by previously deflecting the deflector 204, 204' according to the distance $\Delta ya$, $\Delta yb$, $\Delta yc$, $\Delta yd$.

Figure 4:
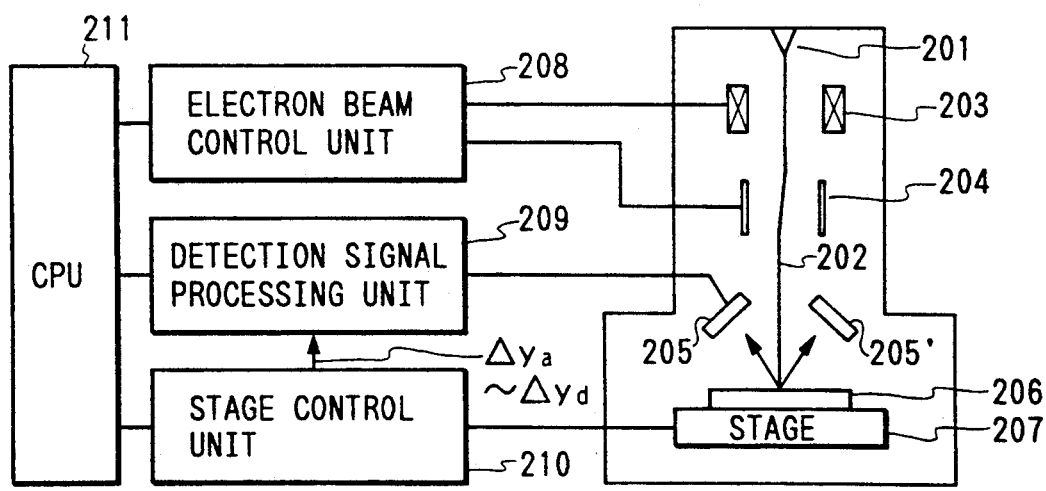
FIG. 4 is a schematic block diagram of the electron beam lithography apparatus of the present invention.

By the way, two reflected-electron detectors designated by numeral 205, 205' in FIG. 4 are set at an equal distance from the positional origin 400 of the electron beam and the sum of the outputs of the both reflected-electron detectors becomes the chip-mark position signals 41D, 41C, 41B, and 41A.

FIG. 4 shows the electron beam lithography which is performed lithography method as stated above. The electron beam 202 is focussed by a electron lens 203 on the wafer 206 and deflected by a deflector 204. The wafer mounted on the stage 207 is moved by a stage control unit 210. Reflected electrons from the wafer 206 are detected by a pair of detectors 205, 205' and the output signals from the detectors are processed by a signal processing unit 209. The electron lens 203 and the deflector 204 are controlled so as to lithograph a predetermined patterns. CPU 211 controls the stage control unit 210 and the electron beam control unit 208 based on output signals from the signal processing unit 209.

A detail block diagram of the signal processing unit 209 is shown in FIG. 6.

The number of reflected-electron detectors is not necessarily restricted to "two" as shown in FIG. 4. It is possible to further increase the number of detectors if they are symmetrically set at equal distances from the positional origin 400.

Figure 3:
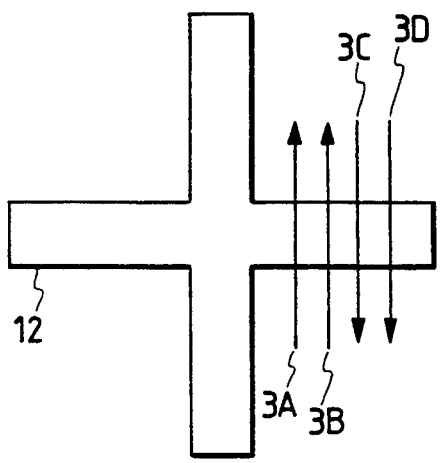
FIG. 3 is an illustrative view of a mark scanning with an electron beam.

FIG. 3 is an illustration for the above beam scanning. The chip mark 12 is scanned with electron beam 202 in the directions indicated by the arrows, for example, 3A to 3D. Therefore, it is possible to improve the S/N of reflected signals by adding the reflected signals obtained by scanning the same portion in the same direction several times.

We claim:

1. An electron beam lithography method for positioning a sample mounted on a sample stage by detecting positions of alignment marks on the sample through electron beam scanning and lithographing a plurality of patterns on the sample on the basis of the detected positions, comprising the steps of:

moving the alignment marks on the sample to positions symmetrical with respect to positional origin of the electron beam where the electron beam which is not deflected by applying deflector;

detecting the waveforms of signals reflected from the alignment marks by applying the electron beam to the alignment marks at each symmetric position; and adding the detected waveforms so as to obtain a waveform reflected from the alignment mark at the positional origin.

2. An electron beam lithography method according to claim 1, wherein
   said detecting of the waveforms is performed while continuously moving the alignment marks on the sample to the positions symmetrical with respect to the positional origin.

3. An electron beam lithography method according to claim 1, wherein
   said positions are located at equal distances from the positional origin of the electron beam.

4. An electron beam lithography method according to claim 1, wherein
   said positions are composed by a plurality set of symmetrical positions which are located at equal distance from the positional origin of the electron beam.

5. An electron beam lithography method according to claim 1, wherein
   said applying of the electron beam to the alignment marks at each symmetric position is performed by scanning the electron beam on the each symmetric position.

6. An electron beam lithography method according to claim 5, wherein
   said scanning the electron beam on the each symmetric position is performed plural times towards same direction.

7. An electron beam lithography method according to claim 1, wherein
   said adding of the detected waveforms is performed after shifting the times of the detected waveforms so as to correspond the times to a time on which the alignment mark is detected at the positional origin.

8. An electron beam lithography method according to claim 1, wherein
   said adding of the detected waveforms is performed after the deflection of the electron beam is previously corrected according to the differences between the symmetric positions and the positional origin.

* * * * *